US012277058B2

(12) United States Patent
Qin et al.

(10) Patent No.: US 12,277,058 B2
(45) Date of Patent: Apr. 15, 2025

(54) HIERARCHICAL METHODS AND SYSTEMS FOR STORING DATA

(71) Applicant: Alibaba Group Holding Limited, Grand Cayman (KY)

(72) Inventors: Minghai Qin, Fremont, CA (US); Chunsheng Liu, Pleasanton, CA (US); Zhibin Xiao, Sunnyvale, CA (US); Tianchan Guan, Shanghai (CN); Yuan Gao, Shanghai (CN)

(73) Assignee: Alibaba Group Holding Limited, Grand Cayman (KY)

( * ) Notice: Subject to any disclaimer, the term of this patent is extended or adjusted under 35 U.S.C. 154(b) by 91 days.

(21) Appl. No.: 17/960,053

(22) Filed: Oct. 4, 2022

(65) Prior Publication Data

US 2023/0021511 A1   Jan. 26, 2023

Related U.S. Application Data

(63) Continuation of application No. PCT/CN2020/088761, filed on May 6, 2020.

(51) Int. Cl.
*G06F 12/0802* (2016.01)
*G06N 3/08* (2023.01)

(52) U.S. Cl.
CPC .......... *G06F 12/0802* (2013.01); *G06N 3/08* (2013.01); *G06F 2212/1016* (2013.01)

(58) Field of Classification Search
CPC .................................................. G06F 12/0802
USPC ........................................................ 711/117
See application file for complete search history.

(56) References Cited

U.S. PATENT DOCUMENTS

| | | | |
|---|---|---|---|
| 4,360,869 A | 11/1982 | Stanley et al. | |
| 6,108,100 A | 8/2000 | McVey et al. | |
| 6,164,841 A | 12/2000 | Mattson et al. | |
| 6,735,686 B1 | 5/2004 | Hiraoka et al. | |
| 6,925,021 B2 | 8/2005 | Cowles et al. | |
| 7,146,469 B2 | 12/2006 | Watanabe | |
| 7,734,894 B1* | 6/2010 | Wentzlaff | G06F 15/16 712/15 |
| 2002/0126556 A1 | 9/2002 | Cowles et al. | |
| 2002/0126557 A1 | 9/2002 | Cowles et al. | |
| 2002/0126558 A1 | 9/2002 | Cowles et al. | |
| 2002/0126559 A1 | 9/2002 | Cowles et al. | |
| 2002/0126560 A1 | 9/2002 | Cowles et al. | |
| 2004/0032781 A1 | 2/2004 | Cowles et al. | |
| 2004/0083344 A1 | 4/2004 | Watanabe | |

(Continued)

FOREIGN PATENT DOCUMENTS

| | | |
|---|---|---|
| CN | 101995547 A | 3/2011 |
| CN | 107844321 A | 3/2018 |

(Continued)

*Primary Examiner* — Titus Wong

(57) ABSTRACT

Disclosed are systems and methods that determine whether instances of data (e.g., forward activations, backward derivatives of activations) that are used to train deep neural networks are to be stored on-chip or off-chip. The disclosed systems and methods are also used to prune the data (discard or delete selected instances of data). A system includes a hierarchical arrangement of on-chip and off-chip memories, and also includes a hierarchical arrangement of data selector devices that are used to decide whether to discard data and where in the system the data is to be discarded.

20 Claims, 4 Drawing Sheets

(56) References Cited

U.S. PATENT DOCUMENTS

| | | | |
|---|---|---|---|
| 2006/0288202 A1 | 12/2006 | Doran et al. | |
| 2012/0155167 A1 | 6/2012 | Uehara | |
| 2013/0138436 A1* | 5/2013 | Yu | G06N 3/08 |
| | | | 704/E15.017 |
| 2013/0182515 A1 | 7/2013 | Lin et al. | |
| 2013/0191587 A1 | 7/2013 | Torii | |
| 2013/0311806 A1 | 11/2013 | Felch et al. | |
| 2014/0173208 A1* | 6/2014 | Cho | G06F 12/0897 |
| | | | 711/122 |
| 2016/0026914 A1* | 1/2016 | Yu | G06N 3/08 |
| | | | 706/25 |
| 2017/0039218 A1* | 2/2017 | Prahlad | G06Q 30/0206 |
| 2018/0139145 A1* | 5/2018 | Stanwood | H04N 21/64792 |
| 2018/0196587 A1* | 7/2018 | Bialynicka-Birula | |
| | | | G06F 3/0485 |
| 2019/0243570 A1* | 8/2019 | Mittal | G06F 3/0649 |
| 2020/0034318 A1 | 1/2020 | Nam | |
| 2020/0110990 A1 | 4/2020 | Harada et al. | |
| 2020/0133874 A1 | 4/2020 | Christensen et al. | |
| 2020/0264876 A1* | 8/2020 | Lo | G06N 3/084 |
| 2020/0334093 A1* | 10/2020 | Dubey | G06F 11/0778 |
| 2020/0356861 A1* | 11/2020 | Baker | G06F 18/214 |
| 2020/0380369 A1* | 12/2020 | Case | G06N 3/086 |
| 2021/0056306 A1* | 2/2021 | Hu | G06V 40/193 |

FOREIGN PATENT DOCUMENTS

| | | |
|---|---|---|
| CN | 110837481 A | 2/2020 |
| CN | 111078592 A | 4/2020 |

\* cited by examiner

HIERARCHICAL METHODS AND SYSTEMS FOR STORING DATA

CROSS-REFERENCES TO RELATED APPLICATIONS

This application is a continuation of copending International Application No. PCT/CN2020/088761, filed May 6, 2020, which is incorporated herein by reference in its entirety.

BACKGROUND

Backward propagation (BP) algorithms are widely used during training of deep neural networks that perform artificial intelligence tasks. In general, BP is used to determine and fine-tune the weights at the neurons (or nodes) of a neural network based on the magnitudes of errors calculated in a previous epoch (e.g., iteration). BP is well known in the art.

Training is performed in "mini-batches," each consisting of tens to hundreds of samples. Each sample passes through the neural network, in the "forward" direction from the input layer through the intervening (or hidden) layers and to the output layer. Each layer can include multiple nodes that can communicate along different paths with one or more other nodes in other layers.

Each sample results in a set of signals, referred to herein as units or instances of data. An activation function defines the output of a node based on the input(s) to the node. Each input to a node may be referred to as an activation. In training a neural network, activations are forward-propagated through the network as mentioned above, and error signals are backward-propagated through the network. The activations in the forward direction can be referred to as forward activations (fw_a) and the error signals can be referred to as the backward derivatives of activations (bw_da), both of which are also referred to herein as instances of data. Changes in the weights (weight gradients) at the nodes are determined as a function of both fw_a and bw_da.

The amount of data (e.g., fw_a, bw_da) produced per epoch, and overall, can be substantial and can exceed on-chip memory capacities. Consequently, some of the data has to be stored off-chip. However, accessing data that is stored off-chip is slower than accessing data that is stored on-chip. Thus, off-chip memory transactions increase latency and reduce computational efficiency, increasing the time it takes to train neural networks, and also increasing the energy consumed by the computer systems that are performing the training.

SUMMARY

Thus, systems or methods that reduce the number of memory transactions in general, and that reduce the number of off-chip memory transactions in particular, would be advantageous. Disclosed herein are systems and methods that provide those advantages, and thereby also reduce latency, increase computational efficiency, reduce the time it takes to train neural networks, and reduce energy consumption.

In embodiments, the disclosed systems and methods are used to determine whether instances of data (e.g., forward activations (fw_a), backward derivatives of activations (bw_da)) are to be stored on-chip or off-chip. The disclosed systems and methods are also used to "prune" the data (discard or delete selected instances of data), to reduce the overall amount of data in general and to reduce the amount of data stored off-chip in particular.

In an embodiment, a system according to the present invention includes a hierarchical arrangement of memories, and also includes a hierarchical arrangement of data selector devices that are used to decide whether to discard data and where in the system the data is to be discarded. In an embodiment, the system includes a system-on-a-chip (SOC) that in turn includes a number of processing engines, a number of memories, and a number of data selector devices. Each processing engine includes a processing unit, a memory (referred to herein as a first memory), and a data selector device (referred to herein as a first data selector device). The SOC also includes a number of other data selector devices (referred to herein as second data selector devices) coupled to the first data selector devices. The SOC also includes a number of other memories (referred to herein as second memories). In an embodiment, each second memory is coupled to a respective second data selector device. The SOC also includes another data selector device (referred to herein as the third data selector device) that is coupled to the second data selector devices. The SOC is coupled to off-chip memory (referred to herein as a third memory). The third memory is coupled to the third data selector device.

In the present embodiment, each first data selector device is operable for selecting instances of data (e.g., fw_a, bw_da) received from its respective processing unit. Instances of data that are not selected by a first data selector device are discarded. At least some instances of data that are selected by a first data selector device are stored in the respective first (on-chip) memory. Instances of data that are selected by a first data selector device and are not stored in a first memory are forwarded to any one of the second data selector devices.

In the present embodiment, each second data selector device is operable for selecting instances of data received from the first data selector devices. Instances of data that are received by and are not selected by a second data selector device are discarded. At least some instances of data that are selected by a second data selector device are stored in the respective second (on-chip) memory. Instances of data that are selected by a second data selector device and are not stored in a second memory are forwarded to the third data selector device.

In the present embodiment, the third data selector device is operable for selecting instances of data received from the second data selector devices. Instances of data that are received by and are not selected by the third data selector device are discarded. Instances of data that are selected by the third data selector device are stored in the third (off-chip) memory.

Various tests or methodologies can be used by the first, second, and third data selector devices to select (or discard) instances of data. In an embodiment, each first data selector device compares values of the instances of data and a threshold value, and selects the instances of the data that have a respective value that satisfies the threshold value. In other words, for example, if the value of an instance of data is less than a minimum value, then the instance of data is discarded.

In an embodiment, each second data selector device randomly selects instances of data to store and instances of data to discard.

In an embodiment, the third data selector device sorts the instances of the data from highest value to lowest value, and selects a percentage of the instances of data based on the sort. In other words, for example, the third data selector device selects the top X percent of the sorted values.

Embodiments according to the invention thus reduce the amount of data that is stored off-chip, thereby reducing the number of off-chip memory transactions. Overall, the amount of data is reduced, thereby reducing the total number of memory transactions (both on-chip and off-chip) during training of deep neural networks.

The above, and other, objects and advantages of the various embodiments of the present invention will be recognized by those of ordinary skill in the art after reading the following detailed description of the embodiments that are illustrated in the various drawing figures.

BRIEF DESCRIPTION OF DRAWINGS

The accompanying drawings, which are incorporated in and form a part of this specification and in which like numerals depict like elements, illustrate embodiments of the present disclosure and, together with the detailed description, serve to explain the principles of the disclosure.

DETAILED DESCRIPTION

Figure 1:
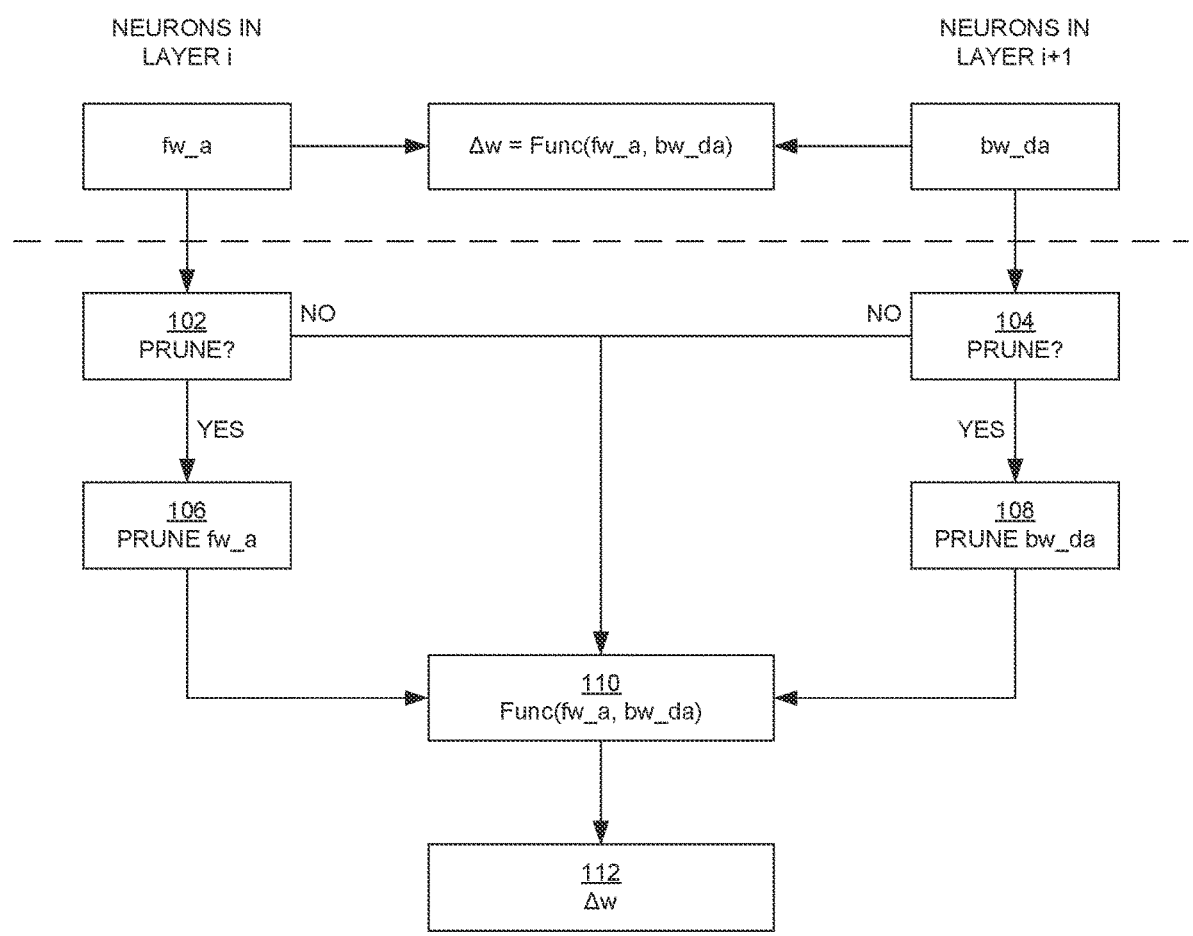
FIG. 1 is a block diagram illustrating a process for managing data during training of a deep neural network that performs artificial intelligence tasks, in embodiments according to the present invention.

Reference will now be made in detail to the various embodiments of the present disclosure, examples of which are illustrated in the accompanying drawings. While described in conjunction with these embodiments, it will be understood that they are not intended to limit the disclosure to these embodiments. On the contrary, the disclosure is intended to cover alternatives, modifications and equivalents, which may be included within the spirit and scope of the disclosure as defined by the appended claims. Furthermore, in the following detailed description of the present disclosure, numerous specific details are set forth in order to provide a thorough understanding of the present disclosure. However, it will be understood that the present disclosure may be practiced without these specific details. In other instances, well-known methods, procedures, components, and circuits have not been described in detail so as not to unnecessarily obscure aspects of the present disclosure.

Some portions of the detailed descriptions that follow are presented in terms of procedures, logic blocks, processing, and other symbolic representations of operations on data bits within a computer memory. These descriptions and representations are the means used by those skilled in the data processing arts to most effectively convey the substance of their work to others skilled in the art. In the present application, a procedure, logic block, process, or the like, is conceived to be a self-consistent sequence of steps or instructions leading to a desired result. The steps are those utilizing physical manipulations of physical quantities. Usually, although not necessarily, these quantities take the form of electrical or magnetic signals capable of being stored, transferred, combined, compared, and otherwise manipulated in a computer system. It has proven convenient at times, principally for reasons of common usage, to refer to these signals as transactions, bits, values, elements, symbols, characters, samples, pixels, or the like.

It should be borne in mind, however, that all of these and similar terms are to be associated with the appropriate physical quantities and are merely convenient labels applied to these quantities. Unless specifically stated otherwise as apparent from the following discussions, it is appreciated that throughout the present disclosure, discussions utilizing terms such as "receiving," "sending;" "forwarding," "accessing," "determining," "using," "storing," "selecting," "discarding," "deleting," "reading," "writing," "executing," "comparing," "satisfying," "sorting," "ranking," "training," or the like, refer to actions and processes (e.g., the flowchart 400 of FIG. 4) of an apparatus or computer system or similar electronic computing device or system (e.g., the systems 200 and 300 of FIGS. 2 and 3, respectively). A computer system or similar electronic computing device manipulates and transforms data represented as physical (electronic) quantities within memories, registers or other such information storage, transmission or display devices.

Embodiments described herein may be discussed in the general context of computer-executable instructions residing on some form of computer-readable storage medium, such as program modules, executed by one or more computers or other devices. By way of example, and not limitation, computer-readable storage media may comprise non-transitory computer storage media and communication media. Generally, program modules include routines, programs, objects, components, data structures, etc., that perform particular tasks or implement particular abstract data types. The functionality of the program modules may be combined or distributed as desired in various embodiments.

Computer storage media includes volatile and nonvolatile, removable and non-removable media implemented in any method or technology for storage of information such as computer-readable instructions, data structures, program modules or other data. Computer storage media includes, but is not limited to, random access memory (RAM), read only memory (ROM), electrically erasable programmable ROM (EEPROM), flash memory (e.g., an SSD) or other memory technology, compact disk ROM (CD-ROM), digital versatile disks (DVDs) or other optical storage, magnetic cassettes, magnetic tape, magnetic disk storage or other magnetic storage devices, or any other medium that can be used to store the desired information and that can accessed to retrieve that information.

Communication media can embody computer-executable instructions, data structures, and program modules, and includes any information delivery media. By way of example, and not limitation, communication media includes wired media such as a wired network or direct-wired connection, and wireless media such as acoustic, radio frequency (RF), infrared and other wireless media. Combinations of any of the above can also be included within the scope of computer-readable media.

FIG. 1 is a block diagram illustrating a process 100 for managing data during training of a deep neural network (DNN) that performs artificial intelligence tasks, in embodiments according to the present invention. The DNN includes a number of layers exemplified by the layers i and i+1. Each of the layers includes one or more neurons, or nodes. During training, instances of data (forward activations (fw_a)) pass through the DNN in the forward direction (e.g., from layer i to layer i+1), and instances of data (backward activations of derivatives (bw_da)) also pass through the DNN in the backward direction (e.g., from layer i+1 to layer i). Changes in the weights (weight gradients ($\Delta w$)) at the nodes can be determined as a function of fw_a and bw_da, as shown in the upper portion of FIG. 1 (above the dashed line).

In embodiments according to the invention, in blocks 102 and 104, decisions are made with regard to whether or not to prune (delete, discard, not store) instances of data: fw_a and/or bw_da data, respectively. The decisions can be based, for example, on the amount of data relative to available computer system memory capacity. For example, if the available memory capacity falls below a corresponding threshold value, or if the amount of data exceeds a corresponding threshold value, then data may be pruned. If the decision is not to prune data, then the process 100 proceeds to block 110; otherwise, the process proceeds to block 106 and/or to block 108.

If the decision is to prune data, then fw_a data can be pruned in block 106, and bw_da data can be pruned in block 108. Systems and methods for pruning data are described further below. Note that the decision may be made to prune only fw_a data, or to prune only bw_da data, or to prune both types of data. As will be described further below, pruning data can result in fewer memory transactions (write accesses to memory, read accesses from memory).

In block 110, the fw_a data and the bw_da data are used to calculate the weight gradients $\Delta w$. The weight gradients are output in block 112.

Figure 2:
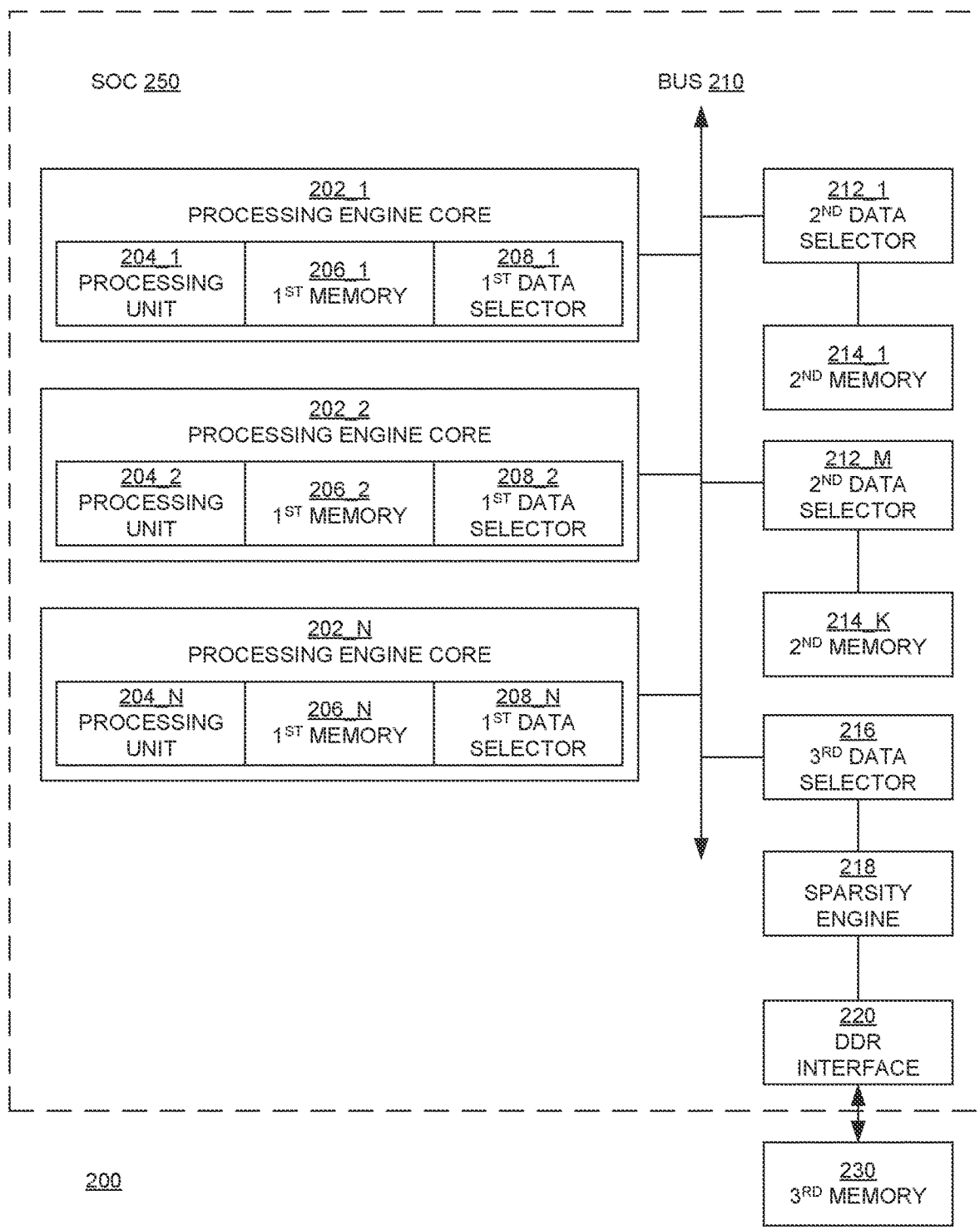
FIG. 2 is a block diagram illustrating a system for managing data and reducing memory transactions in embodiments according to the present invention.

FIG. 2 is a block diagram illustrating a system 200 for managing data and reducing memory transactions in embodiments according to the present invention.

In the FIG. 2 embodiments, the system 200 includes a system-on-a-chip (SOC) 250. The SOC 250 includes a number of on-chip processing engine cores 202_1 to 202_N, where N can be any practical integer value (one or more). The processing engine cores may be referred to collectively as the processing engine cores 202 or individually as the processing engine core 202. In an embodiment, the processing engine cores are each connected to a bus 210.

Each processing engine core 202 includes a respective on-core processing engine or processing unit 204_1 to 204_N. The processing engine or units may be referred to collectively as the processing units 204 or individually as the processing unit 204. A processing unit 204 may be, for example, a calculation unit such as a central processing unit, vector processing unit (VPU), matrix multiplication unit (MMU), or the like, although the present invention is not so limited.

Each processing engine core 202 also includes a respective on-core memory 206_1 to 206_N. The on-core memories may be referred to collectively as the first memories 206 or individually as the first memory 206. The first memories 206 may be implemented as, for example, caches, buffers, static random access memories (SRAMs), or dynamic random access memories (DRAMs), although the present invention is not so limited.

In embodiments, each processing engine core 202 also includes a respective on-core data selector device 208_1 to 208_N. The on-core data selector devices may be referred to collectively as the first data selector devices 208 or individually as the first data selector device 208. Instead of being on-core, the first data selector devices 208 may be separate devices coupled to the processing engine cores 202. Generally speaking, each first data selector device 208 is coupled to a respective processing unit 204.

In embodiments, the SOC 250 also includes a number of other on-chip data selector devices 212_1 to 212_M, where M can be any practical integer value (one or more). These data selector devices may be referred to collectively as the second data selector devices 212 or individually as the second data selector device 212. The second data selector devices 212 are coupled to the bus 210 and are thereby also coupled to the processing engine cores 202, and specifically to the first data selector devices 208.

The SOC 250 also includes a number of other on-chip memories 214_1 to 214_K, where K can be any practical integer value (one or more). These other memories may be referred to collectively as the second memories 214 or individually as the second memory 214. Generally speaking, transactions between the processing units 204 and the first memories 206 are executed faster than transactions between the processing units and the second memories 214. That is, in the hierarchy of memories, the first memories 206 are physically closer to the processing units 204 than the second memories 214.

In an embodiment, each second memory 214 is coupled to a respective second data selector device 212. That is, in an embodiment, there is a one-to-one correspondence between the second data selector devices 212 and the second memories 214 (M is equal to K); however, the present invention is not so limited. The second memories 214 may be implemented as, for example, SRAMs or DRAMs, although the present invention is not so limited.

In embodiments, the SOC 250 also includes yet another on-chip data selector device, referred to the third data selector device 216. The third data selector device 216 is coupled to the bus 210 and is thereby also coupled to the second data selector devices 212.

The SOC 250 is coupled to off-chip memory, referred to as the third memory 230. The third memory 230 is coupled to the third data selector device 216. The third memory 230 may be implemented as, for example, a DRAM, although the present invention is not so limited. Generally speaking, transactions between the processing units 204 and the second memories 214 are executed faster than transactions between the processing units and the third memory 230, because the second memories are physically closer to the processing units 204 and also because the third memory is off-chip.

In an embodiment, the SOC 250 includes other components or devices coupled between the third data selector device 216 and the third memory 230, such as but not limited to a sparsity engine 218 and a double data rate (DDR) interface 220. The sparsity engine 218 can be used to determine whether only a small number of the instances of data output by the third data selector device 216 are non-zero.

Various tests or methodologies can be used by the first data selector devices 208, the second data selector devices 212, and third data selector device 216 to select (or discard) instances of data. The type of data selector device can be selected according to the type of test or mechanism performed by the device. Other factors for selecting a type of data selector device include the impact on overall system performance such as accuracy, latency and speed, power consumption, and hardware overhead (e.g., the space occupied by the device). The type of data selector device can also depend on where the device is in the hierarchy of data selector devices in the system 200. For example, the first data selector devices 208 are higher in the hierarchy; thus, there are more of them. Also, they will receive and evaluate more instances of data than the second data selector devices 212 and the third data selector 216. Accordingly, the type of the first data selector devices 208 has more constraints than the types of data selector devices used lower in the hierarchy of data selector devices. For example, relative to the other data selector devices that are lower in the hierarchy, the first data selector devices 208 will preferably occupy less space and be better in terms of latency, speed, and power consumption. Similarly, the second data selector devices 212 will have more constraints than the third data selector device 216.

In embodiments, each first data selector device 208 is operable for selecting instances of data (e.g., fw_a, bw_da) received from its respective processing unit 204. Instances of data that are not selected by a first data selector device 208 are discarded. At least some instances of data that are selected by a first data selector device 208 are stored in the respective first (on-chip) memory 206. Instances of data that are selected by a first data selector device 208 and are not stored in the first memory 206 are forwarded to any one of the second data selector devices 212.

In an embodiment, each first data selector device 208 compares values (specifically, the absolute values) of the instances of data and a threshold value, and selects the instances of the data that have a respective value that satisfies the threshold value. In other words, for example, if the value of an instance of data is less than a minimum value, then the instance of data is discarded. In an embodiment, the first data selector devices 208 are implemented in hardware as comparators. The threshold value used by the first data selector devices 208 can be programmable. For example, the threshold value can be changed from one epoch to another according to factors such as desired accuracy, desired training time, desired computational efficiency, available on-chip memory capacity, and other factors mentioned herein.

In embodiments, each second data selector device 212 is operable for selecting instances of data received from the first data selector devices 208. Instances of data that are received by and are not selected by a second data selector device 212 are discarded. At least some instances of data that are selected by a second data selector device 212 are stored in the respective second (on-chip) memory 214. Instances of data that are selected by a second data selector device 212 and are not stored in the second memory 214 are forwarded to the third data selector device 216.

In an embodiment, each second data selector device 212 randomly selects instances of data to store and instances of data to discard. In an embodiment, the second data selector devices 212 are implemented in hardware using random number generators and registers that associate a random number (e.g., a zero or a one) with each instance of data. Then, for example, instances of data associated with a value of one are discarded. The random number generator can be programmed such that a certain percentage of the instances of data are associated with one value (e.g., one), thus causing that percentage of the instances of data to be discarded. The percentage value used by the random number generator can be programmable. For example, the percentage value can be changed from one epoch to another according to factors such as desired accuracy, desired training time, desired computational efficiency, available on-chip memory capacity, and other factors mentioned herein.

In embodiments, the third data selector device 216 is operable for selecting instances of data received from the second data selector devices 212. Instances of data that are received by and are not selected by the third data selector device 216 are discarded. Instances of data that are selected by the third data selector device are stored in the third (off-chip) memory 230.

In an embodiment, the third data selector device 216 sorts the instances of the data from highest value to lowest value (e.g., using the absolute values of the instances of data), and selects a percentage of the instances of data based on the sort. In other words, for example, the third data selector device 216 selects the top X percent of the sorted values or the top Y values (Y is an integer). In an embodiment, the third data selector device 216 is implemented in hardware as comparators and registers. The value of X or Y used by the third data selector device 216 can be programmable. For example, the value of X or Y can be changed from one epoch to another according to factors such as desired accuracy, desired training time, desired computational efficiency, and other factors mentioned herein.

Figure 3:
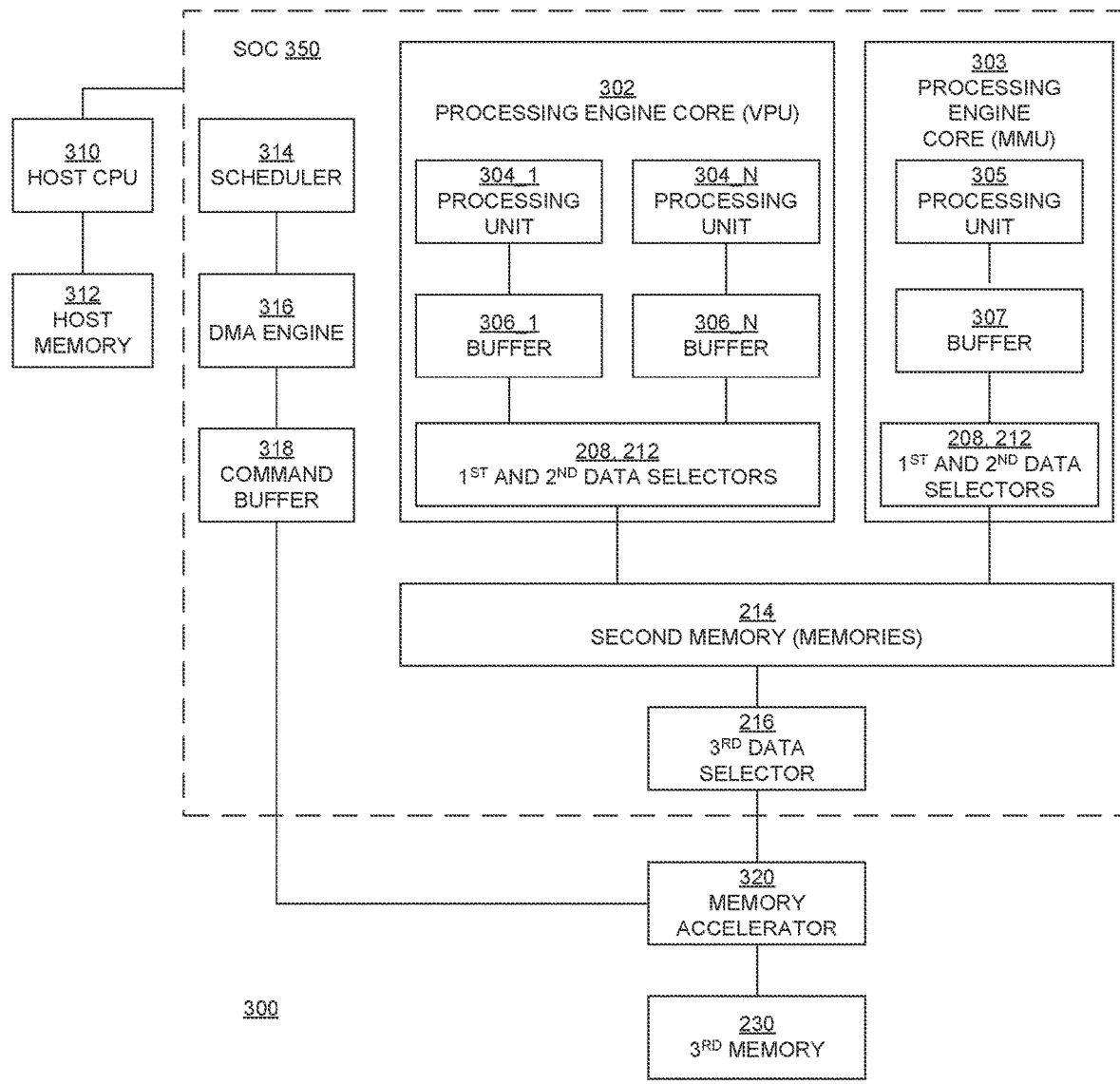
FIG. 3 is a block diagram illustrating a system for managing data and reducing memory transactions in embodiments according to the present invention.

FIG. 3 is a block diagram illustrating a system 300 for managing data and reducing memory transactions in embodiments according to the present invention. The system 300 is analogous to and represents a particular manner of implementing the system 200 of FIG. 2. Like numerals depict like elements.

In the example of FIG. 3, the SOC 350 is coupled to a host CPU 310, which in turn is coupled to a host memory 312 (e.g., a DRAM). The SOC 350 includes a scheduler 314, a direct memory access (DMA) engine 316, and a command buffer 318.

The SOC 350 also includes processing engine cores 302 and 303, which are analogous to the processing engine cores 202 of FIG. 2. In an embodiment, the processing engine core 302 is a VPU that includes a number of processing cores 304_1 to 304_N coupled to respective buffers 306_1 to 306_N, which are analogous to the first memories 206 of FIG. 2. In an embodiment, the processing engine core 303 is an MMU and includes a buffer 307 analogous to the first memory 206. The processing engine cores 302 and 303 also include first data selector devices 208 and second data selector devices 212, which are coupled to the second memory 214 (e.g. an SRAM). The SOC 350 also includes a third data selector device 216 coupled to the second memory 214. The third data selector device 350 is coupled to an off-chip memory (e.g., DRAM) accelerator 320, which is in turn coupled to the third (off-chip) memory 230.

The system 300 operates in a manner like that of the system 200, to evaluate instances of data and prune them accordingly, to reduce the number of memory transactions in general and the number of off-chip memory transactions in particular.

Figure 4:
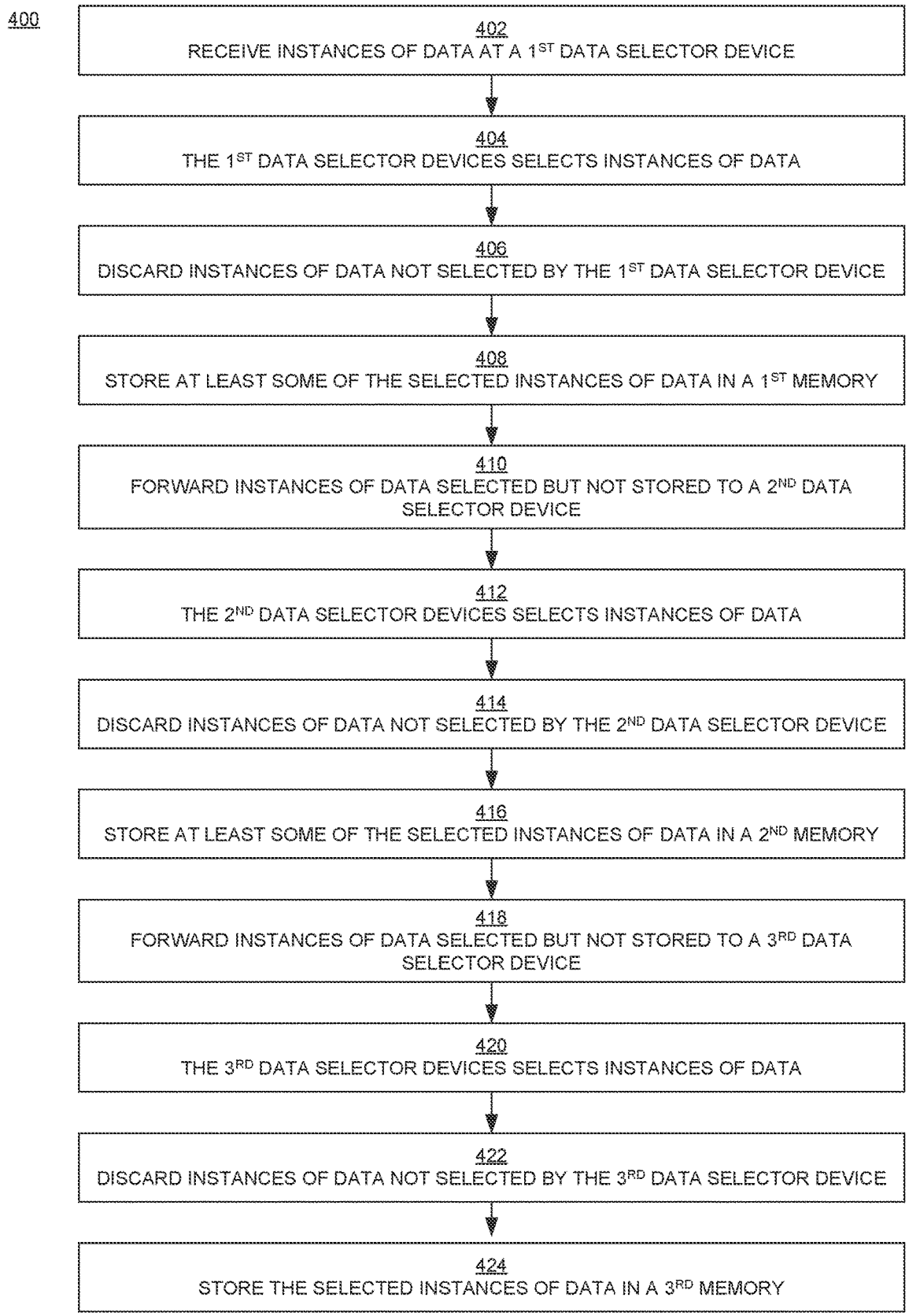
FIG. 4 is a flowchart illustrating operations in a system-implemented method for managing data and reducing memory transactions in embodiments according to the present invention.

FIG. 4 is a flowchart 400 illustrating operations in a method for managing data and reducing memory transactions in embodiments according to the present invention. The flowchart 400 can be implemented on and using the systems 200 and 300 of FIGS. 2 and 3, respectively. The flowchart 400 is described with reference to the elements of FIG. 2, but the description can be readily extended to the system 300 based on the above discussion of FIG. 3.

In block 402 of FIG. 4, instances of data are received at a first data selector device 208 from a processing unit 204.

In block 404, the first data selector device 208 selects instances of data received from the processing unit 204.

In block 406, instances of data that are not selected by the first data selector device 208 are discarded.

In block 408, at least some instances of data that are selected by the first data selector device 208 are stored in a first memory 206.

In block 410, instances of data that are selected by the first data selector device 208 and are not stored in the first memory 206 are forwarded to a second data selector device 212. Blocks 402, 404, 406, 408, and 410 are similarly performed for each of the processing engine cores 202.

In block 412, the second data selector device 212 selects instances of data received from the first data selector devices 208.

In block 414, instances of data that are not selected by the second data selector device 212 are discarded.

In block 416, at least some instances of data that are selected by the second data selector device 212 are stored in a second memory 214.

In block 418, instances of data that are selected by the second data selector device 212 and are not stored in the second memory 214 are forwarded to a third data selector device 216. Blocks 412, 414, 416, and 418 are similarly performed for of the second data selector devices 212 and second memories 214.

In block 420, the third data selector device 216 selects instances of data received from the second data selector devices 212.

In block 422, instances of data that are not selected by the third data selector device 216 are discarded.

In block 424, instances of data that are selected by the third data selector device 216 in a third memory 230.

The process parameters and sequence of steps described and/or illustrated herein are given by way of example only and can be varied as desired. For example, while the steps illustrated and/or described herein may be shown or discussed in a particular order, these steps do not necessarily need to be performed in the order illustrated or discussed. The various example methods described and/or illustrated herein may also omit one or more of the steps described or illustrated herein or include additional steps in addition to those disclosed.

Also, while the foregoing disclosure sets forth various embodiments using specific block diagrams, flowcharts, and examples, each block diagram component, flowchart step, operation, and/or component described and/or illustrated herein may be implemented, individually and/or collectively, using a wide range of hardware, software, or firmware (or any combination thereof) configurations. In addition, any disclosure of components contained within other components should be considered as examples because many other architectures can be implemented to achieve the same functionality.

While various embodiments have been described and/or illustrated herein in the context of fully functional computing systems or devices, one or more of these example embodiments may be distributed as a program product in a variety of forms, regardless of the particular type of computer-readable media used to actually carry out the distribution. The embodiments disclosed herein may also be implemented using software modules that perform certain tasks. These software modules may include script, batch, or other executable files that may be stored on a computer-readable storage medium or in a computing system. These software modules may configure a computing system or device to perform one or more of the example embodiments disclosed herein.

One or more of the software modules may be implemented in a cloud computing environment. Cloud computing environments may provide various services and applications via the Internet. These cloud-based services (e.g., software as a service, platform as a service, infrastructure as a service, etc.) may be accessible through a Web browser or other remote interface. Various functions described herein may be provided through a remote desktop environment or any other cloud-based computing environment.

Although the subject matter has been described in language specific to structural features and/or methodological acts, it is to be understood that the subject matter defined in the disclosure is not necessarily limited to the specific features or acts described above. Rather, the specific features and acts described above are disclosed as example forms of implementing the disclosure.

Embodiments according to the invention are thus described. While the present disclosure has been described in particular embodiments, it should be appreciated that the invention should not be construed as limited by such embodiments, but rather construed according to the following claims.

What is claimed is:

1. A system, comprising:
a processing unit;
a first memory coupled to the processing unit;
a second memory coupled to the processing unit, wherein memory transactions between the processing unit and the first memory are executed faster than memory transactions between the processing unit and the second memory, wherein the first memory is an on-core memory and the second memory is an on-chip memory;
a first data selector device coupled to the processing unit; and
a second data selector device coupled to the first data selector device;
wherein the first data selector device is operable for selecting instances of data received from the processing unit, wherein instances of data that are not selected by the first data selector device are discarded, wherein at least some instances of data that are selected by the first data selector device are stored in the first memory, and wherein instances of data that are selected by the first data selector device and are not stored in the first memory are forwarded from the first data selector device to the second data selector device for data pruning.

2. The system of claim 1, wherein the first data selector device compares values of the instances of data received from the processing unit and a threshold value, and wherein the instances of the data that are selected by the first data selector device have a respective value that satisfies the threshold value.

3. The system of claim 1, further comprising a third data selector device coupled to the second data selector device;
wherein the second data selector device is operable for selecting instances of data received from the first data selector device, wherein instances of data that are received from the first data selector device and are not selected by the second data selector device are discarded, wherein at least some instances of data that are selected by the second data selector device are stored in the second memory, and wherein instances of data that are selected by the second data selector device and are not stored in the second memory are forwarded from the second data selector device to the third data selector device.

4. The system of claim 3, wherein the second data selector device associates a respective randomly selected value with each of the instances of data received from the first data selector device, and wherein the instances of the data that are selected by the second data selector device are randomly selected based on the respective randomly selected value.

5. The system of claim 3, further comprising a third memory coupled to the processing unit, wherein the memory transactions between the processing unit and the second memory are executed faster than memory transactions between the processing unit and the third memory,
- wherein the third data selector device is operable for selecting instances of data received from the second data selector device, wherein instances of data that are received from the second data selector device and are not selected by the third data selector device are discarded, and wherein instances of data that are selected by the third data selector device are stored in the third memory.

6. The system of claim 5, wherein the third data selector device sorts the instances of the data received from the second data selector device into a ranking from highest value to lowest value, and wherein the third data selector device selects a percentage of the instances of data based on the ranking.

7. The system of claim 5, wherein the processing unit, the first memory, the second memory, the first data selector device, and the second data selector device are on a same chip, and wherein the third memory is off the chip.

8. The system of claim 1, wherein the instances of data from the processing unit are selected from the group consisting of: forward activation signals and backward derivative of activation signals, used to determine gradients of weights for nodes during training of an artificial intelligence neural network.

9. A method for managing memory transactions between a processing unit and a plurality of memories, the method comprising:
- receiving, at a first data selector device, instances of data from the processing unit;
- selecting, by the first data selector device, instances of data received from the processing unit;
- discarding instances of data that are not selected by the first data selector device;
- storing at least some instances of data that are selected by the first data selector device in a first memory of the plurality of memories, wherein memory transactions between the processing unit and the first memory are executed faster than memory transactions between the processing unit and other memories of the plurality of memories, wherein the first memory is an on-core memory and the other memories correspond to an on-chip memory and an off-chip memory; and
- forwarding, to a second data selector device for data pruning, instances of data that are selected by the first data selector device and are not stored in the first memory.

10. The method of claim 9, further comprising comparing, by the first data selector device, values of the instances of data received from the processing unit and a threshold value, wherein the instances of the data that are selected by the first data selector device have a respective value that satisfies the threshold value.

11. The method of claim 9, further comprising:
- selecting, by the second data selector device, instances of data received from the first data selector device;
- discarding instances of data that are received from the first data selector device and are not selected by the second data selector device;
- storing at least some instances of data that are selected by the second data selector device in a second memory of the plurality of memories, wherein memory transactions between the processing unit and the second memory are executed slower than memory transactions between the processing unit and the first memory; and
- forwarding, to a third data selector device, instances of data that are selected by the second data selector device and are not stored in the second memory.

12. The method of claim 11, further comprising associating, by the second data selector device, a respective randomly selected value with each of the instances of data received from the first data selector device, wherein the instances of the data that are selected by the second data selector device are randomly selected based on the respective randomly selected value.

13. The method of claim 11, further comprising:
- selecting, by the third data selector device, instances of data received from the second data selector device;
- discarding instances of data that are received from the second data selector device and are not selected by the third data selector device; and
- storing instances of data that are selected by the third data selector device in a third memory of the plurality of memories, wherein memory transactions between the processing unit and the third memory are executed slower than the memory transactions between the processing unit and the second memory.

14. The method of claim 13, further comprising sorting, by the third data selector device, the instances of the data received from the second data selector device into a ranking from highest value to lowest value, wherein the third data selector device selects a percentage of the instances of data based on the ranking.

15. The method of claim 9, wherein the instances of data from the processing unit are selected from the group consisting of: forward activation signals and backward derivative of activation signals, used to determine gradients of weights for nodes during training of an artificial intelligence neural network.

16. A system, comprising:
- a system-on-a-chip, comprising:
  - a plurality of processing engines, each processing engine of the plurality of processing engines comprising a respective processing unit, a respective first memory, and a respective first data selector device of a plurality of first data selector devices, wherein each first memory is an on-core memory;
  - a plurality of second data selector devices coupled to the plurality of first data selector devices;
  - a plurality of second memories, each second memory of the plurality of second memories coupled to a respective second data selector device of the plurality of second data selector devices, wherein each second memory is an on-chip memory; and
  - a third data selector device coupled to the second data selector devices; and
- a third memory coupled to the system-on-a-chip, wherein the third memory is an off-chip memory;
- wherein the respective first data selector device is operable for selecting instances of data received from the respective processing unit, wherein instances of data that are not selected by the respective first data selector device are discarded, wherein at least some instances of data that are selected by the respective first data selector device are stored in the respective first memory, wherein instances of data that are selected by the respective first data selector device and are not stored in the respective first memory are forwarded from the first data selector device to any one of the second data selector devices for data pruning;

wherein further each second data selector device of the plurality of second data selector devices is operable for selecting instances of data received from the plurality of first data selector devices, wherein instances of data that are received by and are not selected by said each second data selector device are discarded, wherein at least some instances of data that are selected by said each second data selector device are stored in a respective second memory of the plurality of second memories, and wherein instances of data that are selected by said each second data selector device and are not stored in the second memories are forwarded from said each second data selector device to the third data selector device; and wherein further the third data selector device is operable for selecting instances of data received from said each second data selector device, wherein instances of data that are received by and are not selected by the third data selector device are discarded, and wherein instances of data that are selected by the third data selector device are stored in the third memory.

17. The system of claim 16, wherein the respective first data selector device compares values of the instances of data received from the respective processing unit and a threshold value, and wherein the instances of the data that are selected by the respective first data selector device have a respective value that satisfies the threshold value.

18. The system of claim 16, wherein said each second data selector device associates a respective randomly selected value with each of the instances of data received from the first data selector devices, and wherein the instances of the data that are selected by said each second data selector device are randomly selected based on the respective randomly selected value.

19. The system of claim 16, wherein the third data selector device sorts the instances of the data received from said each second data selector device into a ranking from highest value to lowest value, and wherein the third data selector device selects a percentage of the instances of data based on the ranking.

20. The system of claim 16, wherein the instances of data are selected from the group consisting of: forward activation signals and backward derivative of activation signals, used to determine gradients of weights for nodes during training of an artificial intelligence neural network.

\* \* \* \* \*